(12) United States Patent
Ono et al.

(10) Patent No.: US 6,949,870 B2
(45) Date of Patent: Sep. 27, 2005

(54) TUNING FORK-TYPE CRYSTAL VIBRATOR

(75) Inventors: Kozo Ono, Saitama (JP); Minoru Ishihara, Saitama (JP); Shingo Kawanishi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/983,945

(22) Filed: Nov. 8, 2004

(65) Prior Publication Data

US 2005/0116587 A1 Jun. 2, 2005

(30) Foreign Application Priority Data

Nov. 10, 2003 (JP) ........................................ 2003-379263
Oct. 28, 2004 (JP) ........................................ 2004-313643

(51) Int. Cl.[7] .............................................. H03H 9/21
(52) U.S. Cl. ...................................... 310/370; 333/200
(58) Field of Search ........................... 310/370; 333/200

(56) References Cited

U.S. PATENT DOCUMENTS

| 6,806,797 | B2 | * | 10/2004 | Kikushima | .................. | 333/200 |
| 2002/0125794 | A1 | * | 9/2002 | Tanaya et al. | ............... | 310/370 |
| 2003/0080652 | A1 | * | 5/2003 | Kawashima | ................ | 310/370 |
| 2005/0040737 | A1 | * | 2/2005 | Tanaya | ....................... | 310/370 |

FOREIGN PATENT DOCUMENTS

| JP | 60140910 A | * | 7/1985 | ........... H03H/3/02 |
| JP | 10206167 A | * | 8/1998 | ........... G01C/19/56 |
| JP | 2000004138 A | * | 1/2000 | ........... H03H/3/02 |
| JP | 2001208546 A | * | 8/2001 | ........... G01C/19/56 |

* cited by examiner

Primary Examiner—Darren Schuberg
Assistant Examiner—J. Aguirrechea
(74) Attorney, Agent, or Firm—Scott D. Wofsy; Edwards & Angell, LLP

(57) ABSTRACT

A tuning fork-type crystal vibrator is provided that has improved CI and shock resistance. The tuning fork-type crystal vibrator includes a tuning fork-shaped crystal element made of a pair of tuning fork arms having grooves in their principal surfaces, and a tuning fork base portion from which the pair of tuning fork arms extends, an outer shape of the tuning fork-shaped crystal element being processed by etching. The tuning fork-type crystal vibrator has a protrusion, formed due to anisotropy of said etching, on a +X surface of the lateral faces of the tuning fork-shaped crystal element, and a first slanted portion rising from a –X direction in a +X direction formed in a tuning fork slit. A tip of the tuning fork slit on a principal surface side is shifted in +X direction from a center line bisecting the tuning fork-shaped crystal element in a width direction to a position at which tuning fork vibrations of the pair of tuning fork arms are balanced.

6 Claims, 10 Drawing Sheets

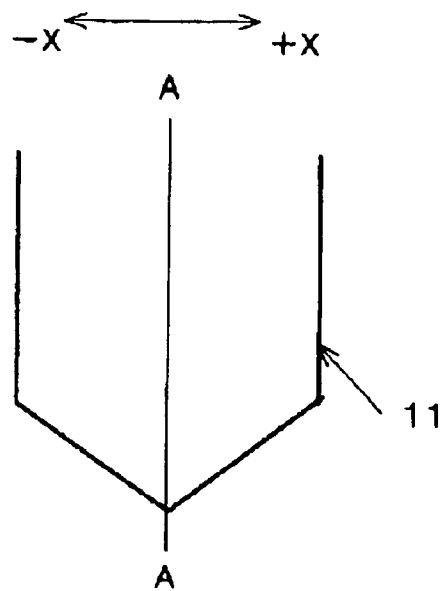 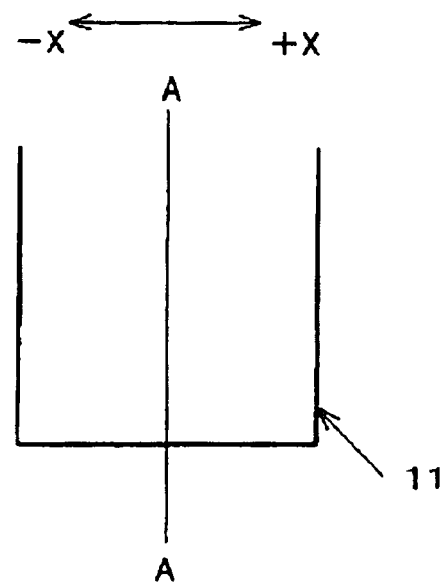
FIG. 5A FIG. 5B
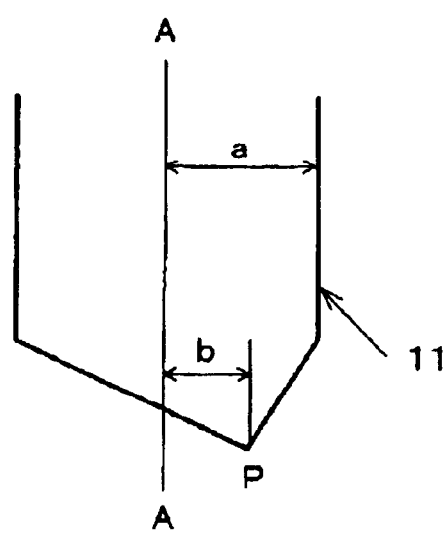
FIG. 5C

TUNING FORK-TYPE CRYSTAL VIBRATOR

BACKGROUND OF THE INVENTION

1. Field of the Invention

The present invention relates to tuning fork-type crystal vibrators (also referred to as "tuning fork-type vibrators" hereinafter) having grooves in both principal surfaces of a pair of tuning fork arms, and in particular to subminiature tuning fork-type vibrators whose shock resistance is improved and whose crystal impedance (also referred to as "CI" hereinafter) is kept small.

2. Description of the Related Art

Tuning fork-type vibrators are widely used as signal sources for keeping time in wrist watches, and in recent years, they have come to be used as synchronization signal sources in portable electronic devices. Thus, as electronic devices are becoming smaller, there is a growing demand for smaller tuning fork-type vibrators.

FIG. 7A and FIG. 7B are diagrams illustrating a conventional example of a tuning fork-type vibrator. FIG. 7A is a diagrammatic view of a tuning fork-type vibrator and FIG. 7B is a cross-sectional view of the pair of tuning fork arms taken along M—M in FIG. 7A, indicating the electric field direction.

The tuning fork-type vibrator includes, as shown in FIG. 7A, a tuning fork-shaped crystal element 1. As for the crystallographic axes (XYZ) of the crystal element 1, the X-axis extends along the width direction, the Y-axis extends along the length direction, and the Z-axis extends along the thickness direction. The tuning fork-shaped crystal element 1 is made of a tuning fork base portion 2 and a pair of tuning fork arms 3a and 3b. The leftward direction of the tuning fork-shaped crystal element 1 is the −X axis and the rightward direction is the +X axis. There is basically no directionality to the Y-axis and the Z-axis. There are grooves 4 in the two principal surfaces of each of the pair of tuning fork arms 3. The tuning fork base portion 2 protrudes in a sloping curve from the outer lateral surfaces of the pair of tuning fork arms 3a and 3b, and has two-level base protrusion portions 2a provided with a level step, widening the width of the tuning fork base portion 2. The curved slopes of the base protrusion portions 2a are formed in correspondence with a U-shaped tuning fork slit, so as to maintain the symmetry of the tuning fork arms 3a and 3b.

Excitation electrodes 5 for exciting tuning fork vibrations based on bending vibrations are formed in the grooves 4 provided in the two principal surfaces of each of the pair of tuning fork arms 3 as well as on the two lateral surfaces of each of the pair of tuning fork arms 3 (see FIG. 7B). The excitation electrodes 5 respectively put the two principal sides and the two lateral surfaces of each of the tuning fork arms 3a and 3b to the same potential, and put the two principal surfaces at opposite potentials to the two lateral surfaces. Moreover, they are wired such that the two principal sides and the two lateral surfaces of the tuning fork arm 3a are at opposite potentials to the two principal sides and the two lateral surfaces of the tuning fork arms 3b, respectively.

As shown in FIG. 8A, one principal surface at the bottom portion of the tuning fork base portion 2 at which lead electrodes (not shown in the drawings) extend from the excitation electrodes 5 is fixed to a raised base 8 in a container 7 by an electrically conductive adhesive 6 or the like that is applied to a predetermined region (surface area) P", thus holding the tuning fork-type vibrator while establishing electrical and mechanical connection. On the outer surface of the container 7, as shown in FIG. 8B, there are mounting terminals (not shown in the drawings) for surface mounting and the tuning fork-shaped crystal element 1 is sealed into the container 7 by placing a cover 9 onto the container 7. It should be noted that FIG. 8A is a front view of the tuning fork-shaped crystal element 1, and FIG. 8B is a cross-sectional view of the tuning fork-type vibrator.

Ordinarily, a plurality of tuning fork-shaped crystal elements 1 are formed by etching using photolithography. For example, a plurality of tuning fork masks 11 are formed by photolithography on a Z-cut crystal wafer 10 (see FIG. 9). Then, the crystal wafer 10 is placed into an etching solution of hydrofluoric acid or the like, and etched, thus obtaining a plurality of tuning fork-shaped crystal elements 1 processed to their outer shapes. In this case, after the processing of the outer shape of the tuning fork-shaped crystal elements 1, the grooves 4 are formed by etching of the two principal surfaces of the tuning fork arms 3a and 3b, and then they are separated into individual tuning fork-shaped crystal elements 1 (see FIG. 7A).

Thus, the grooves 4 are provided and the excitation electrodes 5 are formed in the two principal surfaces of each of the tuning fork arms 3a and 3b, so that the electric field (indicated by arrows in FIG. 7B) generated between the two principal surfaces and the two lateral surfaces of each of the tuning fork arms 3a and 3b is linear and parallel to the X direction. Consequently, compared to the case that the grooves 4 are not formed, the strength of the electric field in X direction can be increased, and strong bending vibrations in Y direction, caused by expansion and contraction in opposite directions at the two lateral surfaces of each of the tuning fork arms 3a and 3b, can be excited.

Moreover, due to the bending vibrations in Y direction, which are in opposite directions in the tuning fork arms 3a and 3b, the pair of tuning fork arms 3a and 3b performs a tuning fork vibration in an opening and closing motion in horizontal direction with the tuning fork slit portion as the center. Consequently, even when the tuning fork-shaped crystal element 1 is small, it is basically possible to obtain a tuning fork-type vibrator with a good CI value, due to the linear electric field that is parallel to the X axis in the tuning fork arms 3a and 3b.

Moreover, the width of the tuning fork base portion 2 is increased beyond the outer lateral surfaces of the pair of tuning fork arms 3a and 3b by providing it with base protrusion portions 2a, so that it can be held by applying the electrically conductive adhesive 6 over a sufficient surface area P" (see FIG. 8A and FIG. 8B). Consequently, damage when the tuning fork-type vibrator is dropped or impacted as well as breaking off of the tuning fork-shaped crystal element 1 can be prevented, thus achieving good mechanical shock resistance. If the width of the tuning fork base portion 2 is made the same as the width between the outer lateral surfaces of the pair of tuning fork arms 3a and 3b for example, then the surface area of the tuning fork base portion 2 becomes small, and also the amount of the electrically conductive adhesive 6 becomes small, thus worsening the mechanical shock resistance. Accordingly, if it is then attempted to provide the electrically conductive adhesive 6 with a large application surface area P, the electrically conductive adhesive 6 must be applied all the way to the bottom portion of the tuning fork arms 3a and 3b, which impedes the tuning fork vibrations and increases the CI value (see PCT International Publication WO 00/44092).

However, in the tuning fork-type vibrator with the above-described configuration, even though the tuning fork-shaped crystal element 1 can be made small, and even though a CI value specified to less than 90 kΩ can be attained by providing the pair of tuning fork arms 3a and 3b with the grooves 4 and a high mechanical strength (mechanical shock resistance) preventing damage or breaking off of the tuning fork-shaped crystal element through drops or impacts can be achieved by ensuring a large application surface area of the electrically conductive resin, there was the problem that it was not possible to attain an even smaller CI value or, in particular, better frequency change characteristics (electrical shock resistance) with regard to drops or impacts.

When the surface area over which the electrically conductive adhesive 6 is applied is large, then the adhesive strength is high and the mechanical shock resistance is improved, but the influence that this manner of support has on the tuning fork vibrations becomes large, and the electrical shock resistance, such as frequency changes in response to drops or impacts becomes poor. Conversely, when the surface area over which the electrically conductive adhesive 6 is applied is small, then the adhesive strength is weakened and the mechanical shock resistance becomes poor, but the influence that this manner of support has on the tuning fork vibrations becomes small, and the electrical shock resistance is improved.

When a crystal wafer is processed by etching, then the etching speed differs depending on the axis direction of the crystal, a phenomenon that is known as "etching anisotropy." The etching speeds in the crystal axis directions X, Y and Z are Z>>+X>−X>Y. Consequently, when a plurality of tuning fork-shaped crystal elements 1 are formed on a crystal wafer 10 as described above (see FIG. 9), then the etching anisotropy causes angular protrusions 12 to be formed on the +X surfaces on the lateral surfaces of the tuning fork-shaped crystal element 1, as shown in the partial front view of FIG. 10A and the top view of FIG. 10B. Also, in the U-shaped portion of the tuning fork slit and the curved portions of the base protrusion portions 2a, angular first and second slanted portions 13a and 13b that rise upward from the −X direction to the +X direction are formed.

Here, the first slanted portion 13a formed in the tuning fork slit is simultaneously etched into the +X surface and −X surface of the tuning fork arms 3a and 3b and the Y surface of the slit bottom. However, the differences of the etching speed can be caused in the +X and the −X directions so that it rises in the +X direction starting from a base point on the left side of the center line A—A bisecting the tuning fork-shaped crystal element 1 in the width direction. Consequently, there is a geometrical asymmetry with respect to the center line A—A bisecting the tuning fork-shaped crystal element 1 in the width direction, and the mass of the right half is larger than the mass of the left half.

Thus, due to the asymmetry (unbalance) in the masses of the two tuning fork arms 3a and 3b including the tuning fork slit, the center of the tuning fork vibrations within the tuning fork slit is displaced from the center line A—A to the right, that is, in the +X direction. As a result, the center of the tuning fork vibrations is shifted from the geometrical center on the center line A—A bisecting the tuning fork-shaped crystal element 1 and the balance is lost, so that vibrations are leaked from the tuning fork base portion 2, and the CI value increases.

In particular, when the length of the pair of tuning fork arms 3a and 3b is large, a shift of the center of the tuning fork vibrations from the geometrical center has a large adverse effect on the balance of the tuning fork vibrations. In this case, the tuning fork-shaped crystal element 1 becomes smaller while the interval between the two tuning fork arms 3a and 3b becomes narrower. Furthermore, the etching of the tuning fork slit is restricted. Thus the remaining mass of the first slanted portion 13a becomes large. Consequently, the influence that the asymmetry has on the CI increases.

Moreover, when the tuning fork-type vibrator is dropped or impacted, a stress depending on the asymmetry of the tuning fork-shaped crystal element 1 occurs, so that the adhesion with the electrically conductive adhesive 6 may change. Therefore, the manner of support of the tuning fork-shaped crystal element 1 is affected, and the vibration frequency may change. Consequently, there was the problem that the frequency change characteristics with regard to drops or impacts are worsened, so that the electrical shock resistance cannot be improved. Needless to say, the mechanical shock resistance, such as resistance against breakage in case of drops or impacts, is also worsened.

In these cases, the CI value of the tuning fork-type crystal vibrator can be made to satisfy the specified CI value for example by increasing the depth of the grooves 4, but it was not possible to prevent a change for the worse, in particular, the frequency change characteristics with regard to drops or impacts (electrical shock resistance). Thus, there was the serious problem of how to improve the electrical shock resistance in order to realize a small tuning fork-type crystal vibrator in which the planar outer dimensions of the tuning fork-shaped crystal element are not larger than 2.3 mm×0.5 mm, for example.

It should be noted that the base protrusion portions 2a may have the affect of reducing the asymmetry due to the first slanted portion 13a, but there was the problem that this alone is insufficient.

It is thus an object of the present invention to provide a tuning fork-type vibrator with decreased CI value and, in particular, with improved shock resistance.

SUMMARY OF THE INVENTION

The present invention is based on an in-depth study of the above-noted problems, and takes advantage of the fact that the CI value can be decreased and in particular the shock resistance can be improved if the asymmetry of the left and right masses with respect to the center line bisecting the tuning fork-shaped crystal element in the width direction is improved.

In accordance with a first aspect of the present invention, a tuning fork-type crystal vibrator comprises a tuning fork-shaped crystal element made of a pair of tuning fork arms having grooves in their principal surfaces, and a tuning fork base portion from which the pair of tuning fork arms extends, an outer shape of the tuning fork-shaped crystal element being processed by etching, wherein the tuning fork-type crystal vibrator has a protrusion, formed due to anisotropy of said etching, on a +X surface of the lateral faces of the tuning fork-shaped crystal element, and a first slanted portion rising from a −X direction in a +X direction formed in a tuning fork slit, and wherein a tip of the tuning fork slit on a principal surface side is shifted in +X direction from a center line bisecting the tuning fork-shaped crystal element in a width direction to a position at which tuning fork vibrations by the pair of tuning fork arms are balanced.

With this tuning fork-type crystal vibrator, the tip of the tuning fork slit on a principal surface side is shifted in the +X direction to a position at which the pair of tuning fork arms is balanced, that is, to a position at which the mass is equalized (made symmetric) with respect to the center of the tuning fork vibrations at the tuning fork slit, so that vibration leakage due to the pair of tuning fork arms can be suppressed, and the CI value can be decreased. Moreover, the occurrence of stress due to asymmetry of the mass when the tuning fork-type crystal vibrator is dropped or impacted is suppressed, and the adhesion of the tuning fork-shaped crystal element with an electrically conductive adhesive or the like is stabilized. Consequently, the shock resistance and in particular the frequency change characteristics (electrical shock characteristics) with regard to drops or impacts can be greatly improved.

BRIEF DESCRIPTION OF THE DRAWINGS

FIG. 5 shows other embodiments, with FIG. 5A, FIG. 5B and FIG. 5C being partial front views of a tuning fork mask.

FIG. 7 shows diagrammatic views of tuning fork-shaped crystal element illustrating a conventional example.

FIG. 8 illustrates the conventional example.

DETAILED DESCRIPTION OF THE PREFERRED EMBODIMENTS

According to a second aspect of the present invention, the position at which the tuning fork vibrations of the pair of tuning fork arms are balanced is a region at which the crystal impedance is minimal. Thus, the position at which the tuning fork vibrations are balanced in accordance with the first aspect of the present invention becomes clear through correlation with the CI value. Also, the frequency change characteristics with respect to drops and impacts can be improved greatly through balancing the mass since the CI value is in the minimal region.

According to a third aspect of the present invention, the region at which the crystal impedance is minimal is a region in which the crystal impedance is increased by 5% from the minimum value of the crystal impedance. Thus, as shown in the following embodiment (experimental example), a value lower than an intermediate value between the conventional CI value and the minimum value is achieved.

According to a fourth aspect of the present invention, the first slanted portion is formed with an asymmetric tuning fork mask having a left-right symmetric U-shape, in which a tip of a U-shape of the tuning fork mask is shifted in the +X direction. Thus, the tip of the tuning fork slit can be shifted to a position in +X direction with respect to the center line.

According to a fifth aspect of the present invention, when "a" represents an interval between the center line for left-right symmetry of the tuning fork mask and a vertical line at the +X surface side of the U-shape, and "b" represents a shift distance by which the tip of the U-shape has been shifted from the center line, the shifting ratio b/a of the shift distance b to the interval a is set to 0.15 to 0.55. Thus, the minimum region of the CI values can be set to a region in which the CI value is increased by 5% over the minimum value.

According to a sixth aspect of the present invention, the tuning fork base portion has base protrusion portions that that protrude from the outer lateral surfaces of the two tuning fork arms and that are wider than a distance between outer lateral surfaces of the two tuning fork arms, and a second slanted portion rising from the −X direction to the +X direction is provided on an upper surface of the base protrusion portion. Thus, the tuning fork base portion is enlarged, the surface area for application of the electrically conductive adhesive 6 is enlarged, and the mechanical shock resistance is improved. Furthermore, the asymmetry of the first slanted portion can be improved with the second slanted portion.

EMBODIMENTS

Figure 1:
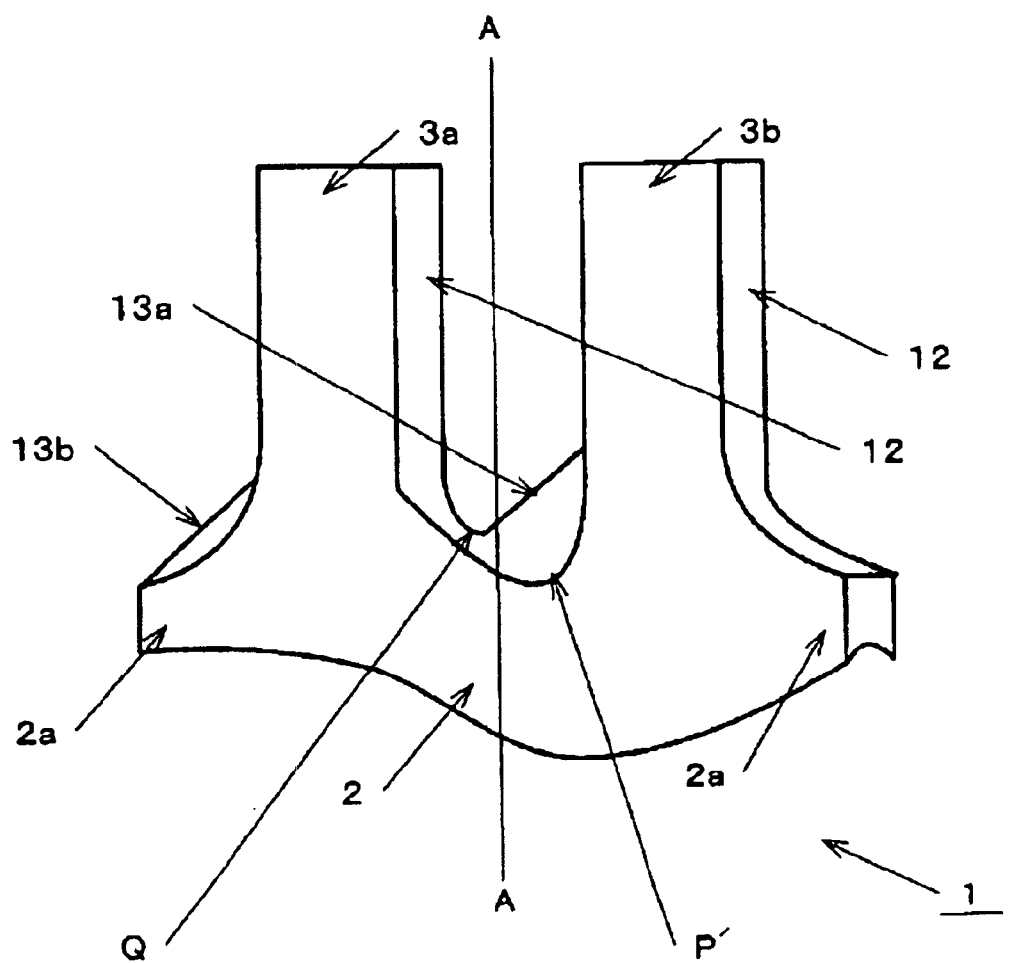
FIG. 1 is a partial front view illustrating an embodiment of a tuning fork-shaped crystal element in accordance with the present invention.

FIG. 1 is a diagram illustrating an embodiment of a tuning fork-type vibrator in accordance with the present invention. It should be noted that portions identical to the above-described conventional example are denoted by identical numerals and their further explanation has been omitted.

The tuning fork-type vibrator includes a tuning fork-shaped crystal element 1, formed by etching and made of a pair of tuning fork arms 3a and 3b having grooves 4 in both of their principal surfaces as described above, and a tuning fork base portion 2 that is wider than the pair of tuning fork arms 3a and 3b and that has two-level base protrusion portions 2a. Due to etching anisotropy, the tuning fork-shaped crystal element 1 has a first slanted portion 13a and a second slanted portion 13b rising from the −X direction to the +X direction in the tuning fork slit and on the slope of the base protrusion portion 2a on the −X side, respectively.

Here, the first slanted portion 13a of the tuning fork slit is controlled to make the mass of the tuning fork-shaped crystal element 1 symmetric with respect to the center line A—A bisecting the tuning fork-shaped crystal element 1 in the width direction. In particular, the left and right masses of the pair of tuning fork arms 3a and 3b including the tuning fork slit are balanced, and a left-right symmetry with regard to the masses is established.

Figure 2A:
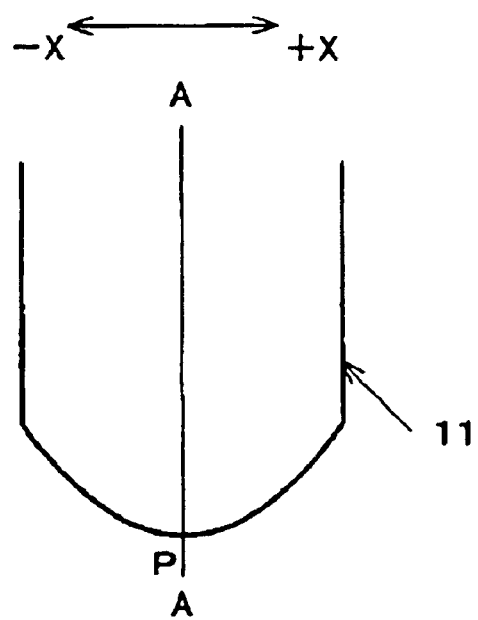
FIG. 2 shows partial front views of a tuning fork mask illustrating an embodiment of the present invention, with FIG. 2A being a symmetrical tuning fork mask and FIG. 2B being an asymmetrical tuning fork mask.
Figure 2B:
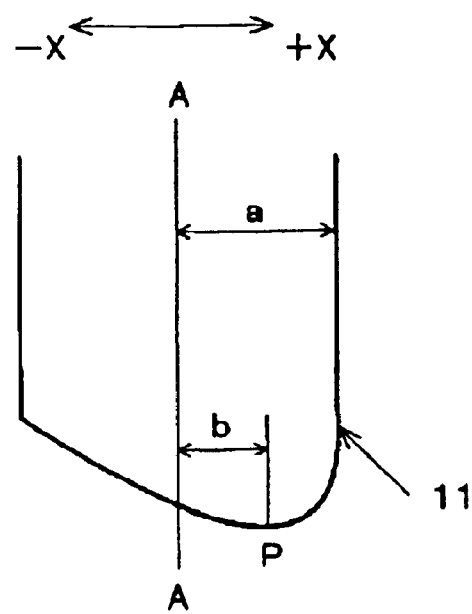
Figure 9:
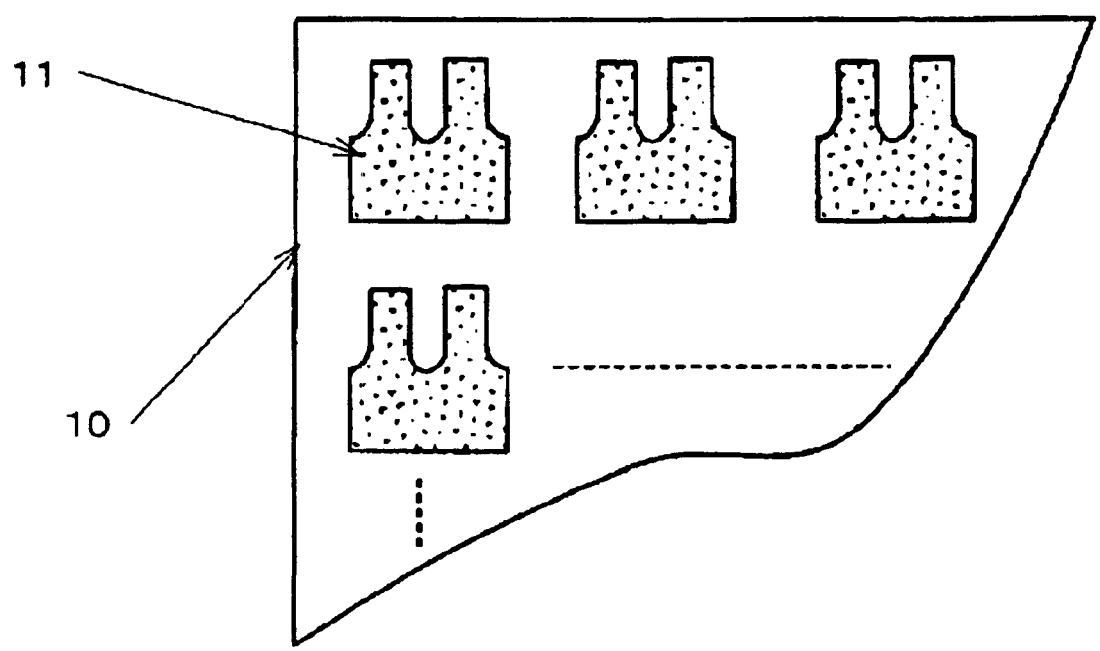
FIG. 9 is a diagram of a crystal wafer on which tuning fork masks are arranged, illustrating the conventional example.
Figure 10A:
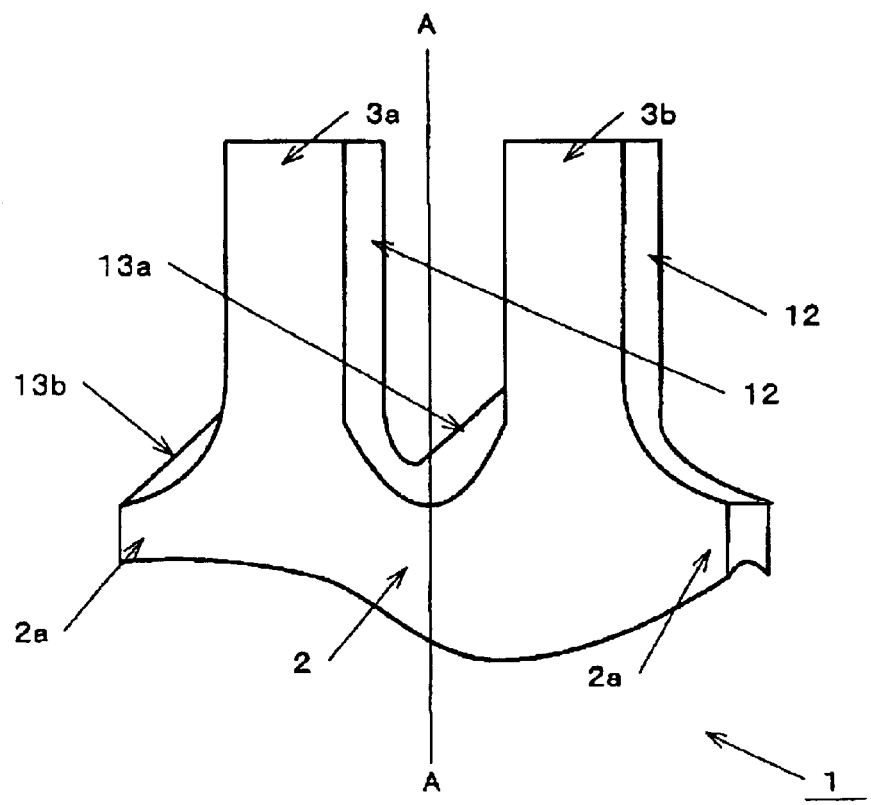
FIG. 10 shows diagrams illustrating problems of the conventional example, with FIG. 10A being a top view of a tuning-fork-shape crystal element and FIG. 10B being a front view of that tuning-fork-shape crystal element.
Figure 10B:
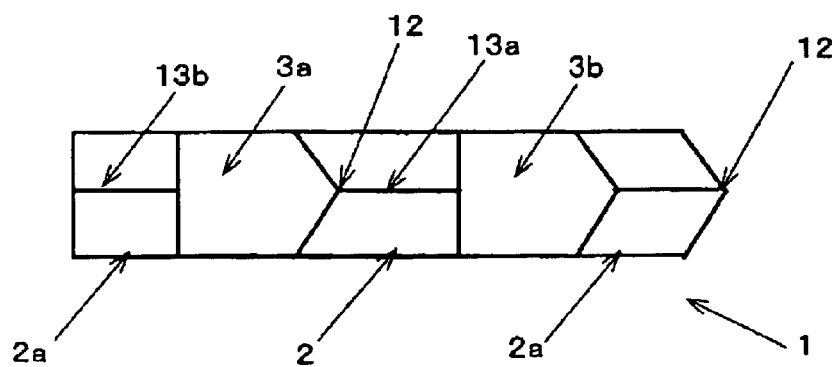

When a plurality of tuning fork-shaped crystal elements 1 are formed together on a crystal wafer 10 as described above (see FIG. 9), they are formed using an asymmetric U-shaped tuning fork mask 11 during etching. That is to say, as shown in FIG. 2, the tuning fork mask 11 is formed such that the tip P of the U-shape of the tuning fork mask 11 is shifted in +X direction. It should be noted that FIG. 2A is a partial view of the conventional example, and FIG. 2B is a partial view of an asymmetrical tuning fork mask in accordance with the present invention.

Thus, the +X side of the tuning fork mask 11 is opened more widely, and the etching amount on this side is increased. Conversely, more of the −X side is concealed by the tuning fork mask 11, thus suppressing etching, and the etching amount on this side is decreased. That is to say, the etching amount increases on the +X side and decreases on the −X side of the first slanted portion 13a, which rises from the −X direction to the +X direction, so that the overall size (i.e., surface area and volume) of the first slanted portion 13a is reduced.

In this case, the tuning fork slit of the etched tuning fork-shaped crystal element 1 takes on an asymmetrical U-shape following the tuning fork mask 11 on the two principal surface sides, and the tip P' of the tuning fork slit is displaced in +X direction, that is, to the right of the center line A—A, just like the U-shape tip P' of the tuning fork mask. However, the base point Q of the first slanted portion 13a is positioned in −X direction, that is, to the left of the center line A—A, regardless wither the tuning fork mask 11 is symmetric as conventionally, or asymmetric as in accordance with the present invention.

Thus, in the present embodiment, the left and right masses of the first slanted portion 13a with respect to the center line A—A of the tuning fork-shaped crystal element 1 are equalized. Consequently, also the masses of the two (left and right) tuning fork arms 3a and 3b of the tuning-fork-shaped crystal element 1 are equalized, and the center of the tuning fork vibrations can be caused to coincide with or approximate the center line A—A bisecting the tuning fork-shaped crystal element 1.

Figure 3:
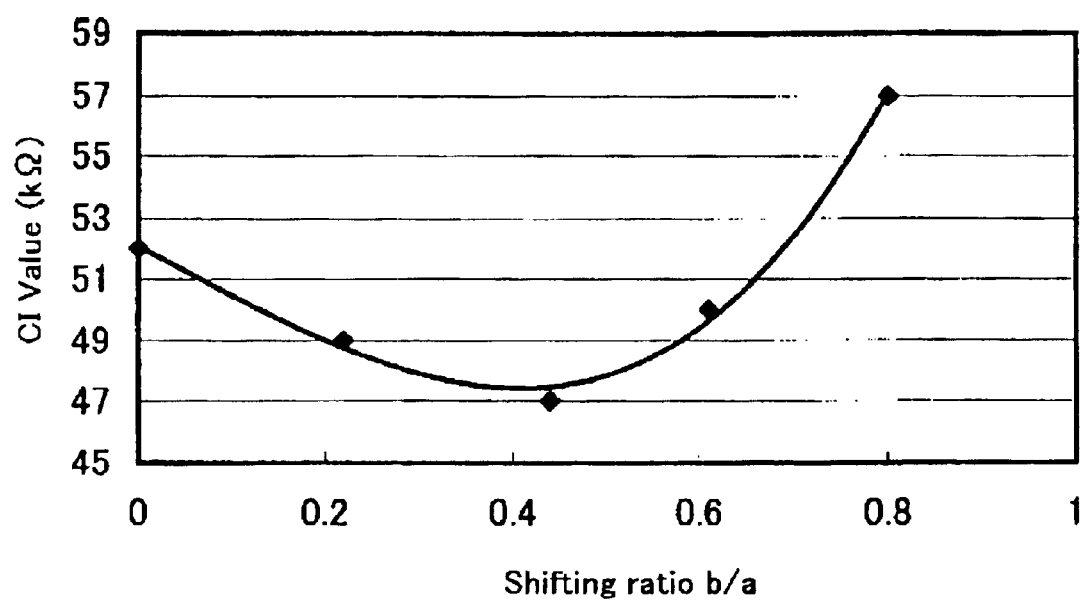
FIG. 3 is a graph of the CI characteristics illustrating the operation of an embodiment in accordance with the present invention.

FIG. 3 is a graph showing the CI value as a function of the shifting ratio b/a. Here, "a" represents the interval between the center line A—A of the left-right symmetry of the tuning fork mask 11 and the vertical line at the +X surface side of the U-shape, and "b" represents the shifting distance by which the tip P of the U-shape has been shifted from the center line A—A. It should be noted that this graph of the CI characteristics is an approximating curve based on five measurement points for the shifting ratios b/a of 0, 0.22, 0.44, 0.61 and 0.80.

It should be noted that in this case the total length of the tuning fork-shaped crystal element is 2.25 mm, the width of the tuning fork base portion is 0.5 mm, the length of the pair of tuning fork arms 3a and 3b is 1.65 mm, their width and thickness are 0.1 mm, and the width of the tuning fork slit is 0.1 mm. Moreover, the length of the groove provided in the two principal surfaces of the tuning fork arms is 0.83 mm, the groove width is 0.065 mm and the groove depth is 0.035 mm (35 μm), and the nominal vibration frequency is 32.768 kHz. The depth of the curvature portion in the U-shape of the tuning fork mask is 0.045 mm, and the width of the U-shape tip is 0.03 mm. The tuning fork mask is overall U-shaped, and the curvature portion is formed by a plurality of continuous lines.

As becomes clear from the graph of the CI characteristics in FIG. 3, the CI for the conventional example at the shifting ratio b/a of 0 (when the tuning fork mask is symmetrical) is about 52 KΩ. When, in accordance with the technical idea of the present invention, the shifting ratio b/a is 0.22, then the CI is 49 KΩ, at a shifting ratio of 0.44 the CI is 47 KΩ, at a shifting ratio of 0.61 the CI is 50 KΩ, and at a shifting ratio of 0.80 the CI is 57 KΩ.

As can be seen from the approximating curve based on these measurement points (see FIG. 3), when the shifting ratio b/a is increased from 0, the CI becomes smaller, and at a shifting ratio of about 0.4, the CI takes on a minimum value of 47 KΩ. And when the shifting ratio b/a is further increased, the CI becomes larger. At a shifting ratio b/a of about 0.70, the CI takes on the same value (52 KΩ) as for a shifting ratio b/a of 0, and at even larger shifting ratios b/a, the CI becomes even larger.

The following can be concluded from these experimental results: After etching with a left-right symmetric tuning fork mask with a shifting ratio b/a of 0, the mass of the tuning fork arm 3b on the +X side (on the right side in the FIG. 1) becomes larger, due to the first slanted portion 13a of the tuning fork slit. Consequently, the symmetry between the left and right masses is lost after etching, the balance of the tuning fork vibrations is lost, and the initial CI becomes poor (52 KΩ).

When the shifting ratio b/a is increased by making the tuning fork mask asymmetric, then the tip P' on the principal surface side of the tuning fork slit is displaced to the +X direction with respect to the center line A—A, and the first slanted portion 13a becomes smaller. Accordingly, the left and right masses are equalized, thus increasing the CI, and when the left and right masses match one another, the CI becomes minimal (47 KΩ). And when the shifting ratio b/a is further increased, the mass of the first slanted portion 13a is further decreased, and the mass remaining on the inner side of the tuning fork arm 3a (on the left side in FIG. 1) becomes large. Consequently, the symmetry between the masses is lost again, and after reaching the same value as initially (at a shifting ratio b/a of 0), the CI value increases even further, and becomes even poorer than the initial value.

In view of the foregoing, the tuning fork mask 11 in the present embodiment is made asymmetric (see FIG. 2B), and the first slanted portion 13a of the tuning fork slit is controlled such that the mass of the tuning fork-shaped crystal element 1, and in particular the tuning fork arms 3a and 3b, becomes left-right symmetric (balanced) with respect to the center line A—A. More specifically, it is set to a CI value (about 50 KΩ) that is not more than half the minimum CI value (47 KΩ) and the conventional initial value (52 KΩ). In this case, the shifting ratio b/a should be set to about 0.15 to 0.55. Thus, if the effect of the minimal value of the CI (47 KΩ) is taken as 100%, an effect of at least about 50% can be achieved.

Figure 4A:
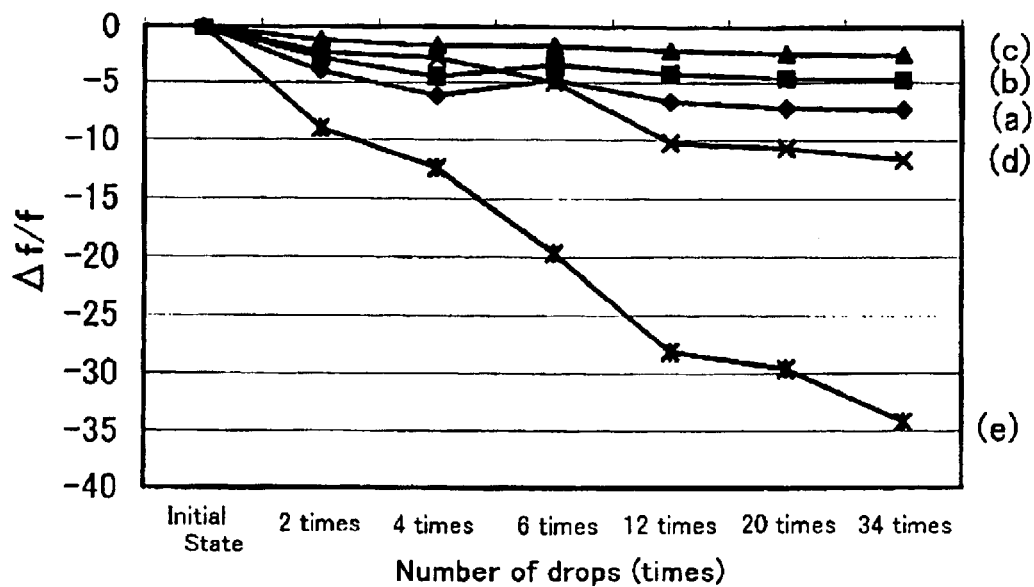
FIG. 4 shows graphs illustrating the operation of an embodiment in accordance with the present invention, with both FIGS. 4A and 4B being graphs of the shock resistance characteristics.

FIG. 4A is a graph showing the frequency change characteristics before and after dropping the tuning fork-type crystal vibrator (electrical shock resistance), taking the shifting ratio b/a as a parameter. The horizontal axis denotes the number of times the tuning fork-type vibrator has been dropped, and the vertical axis denotes a frequency deviation Δf/f (ppm). Here, "f" denotes the nominal vibration frequency (in kHz), for example 32.768 kHz, and "Δf" denotes a frequency difference (Hz) of a measured vibration frequency at room temperature to this nominal vibration frequency f.

To measure the shock (drop) resistance characteristics, the tuning fork-type vibrator was placed on a set substrate, an overall load of 150 kg was applied to it, and the tuning fork-type vibrator was dropped onto a concrete floor from a height of 1.8 m, varying its dropping orientation between drops. This was repeated 34 times. The frequency discrepancies were taken as the measured shock (drop) resistance characteristics. Like for the measurement of the CI characteristics, the shifting ratios b/a were set to 0. 0.22, 0.44, 0.61, and 0.80. Curve (a) illustrates the case that the shifting ratio b/a serving as the parameter is 0 (conventional case), and curves (b), (c), (d) and (e) illustrate shifting ratios b/a of 0.22, 0.44, 0.61 and 0.80.

Figure 6:
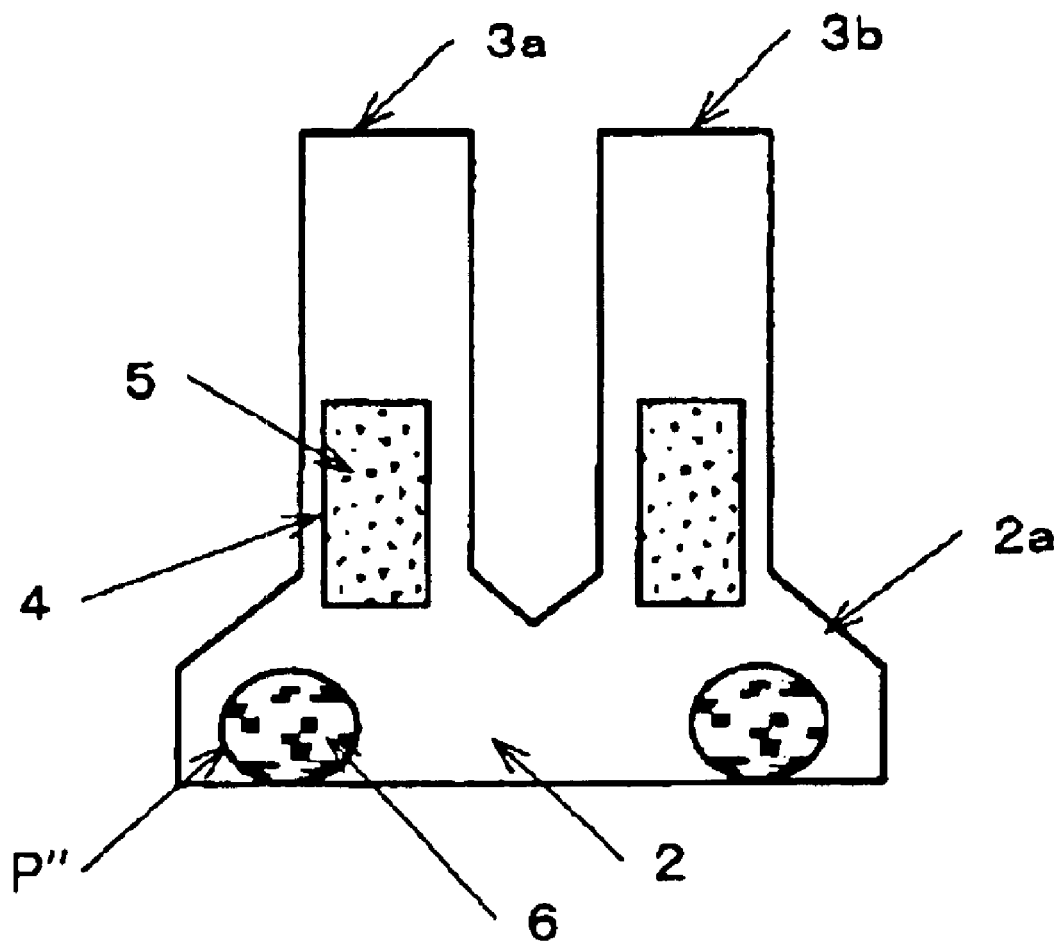
FIG. 6 shows a front view illustrating another embodiment of a tuning fork-shaped crystal element in accordance with the present invention.
Figure 7A:
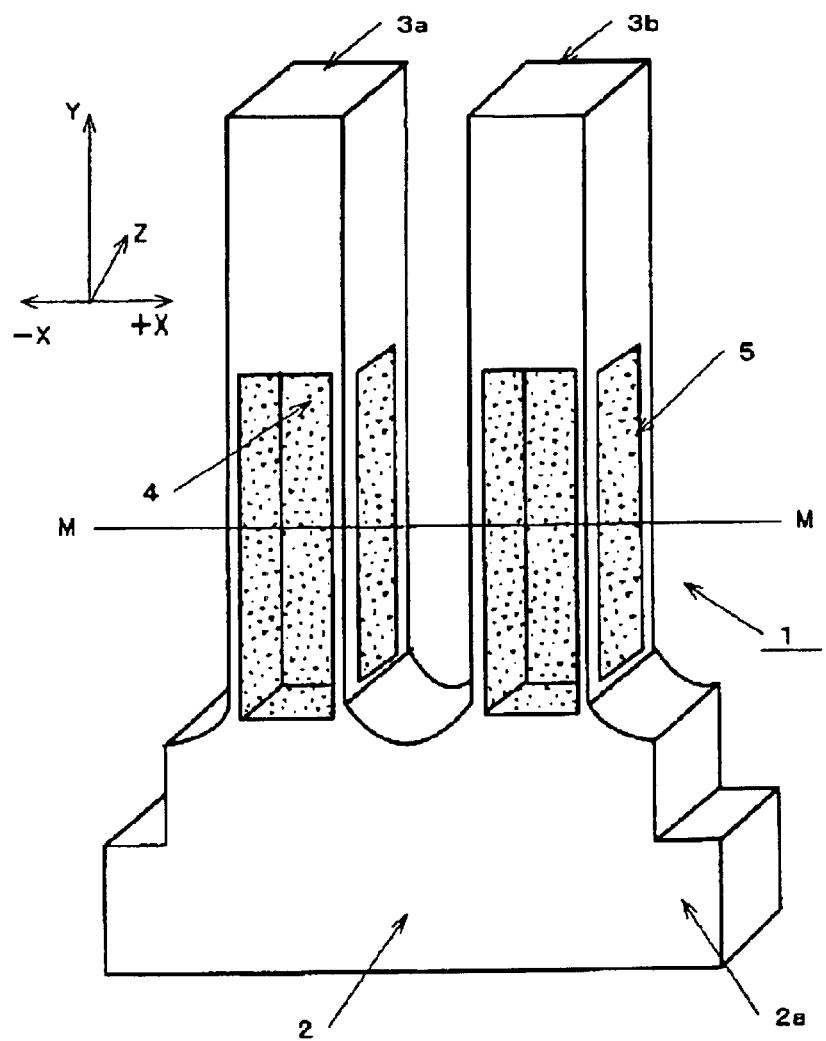
FIG. 7A is a diagrammatic view of a tuning fork-type vibrator and FIG. 7B is a cross-sectional view of the pair of tuning fork arms taken along M—M in FIG. 7A, indicating the electric field direction.
Figure 7B:
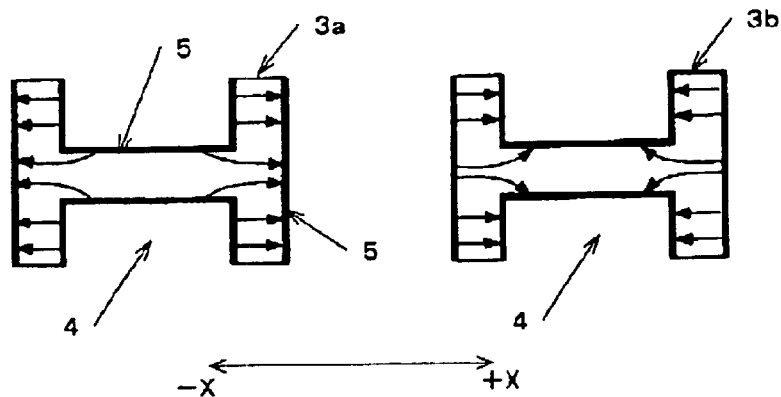
Figure 8A:
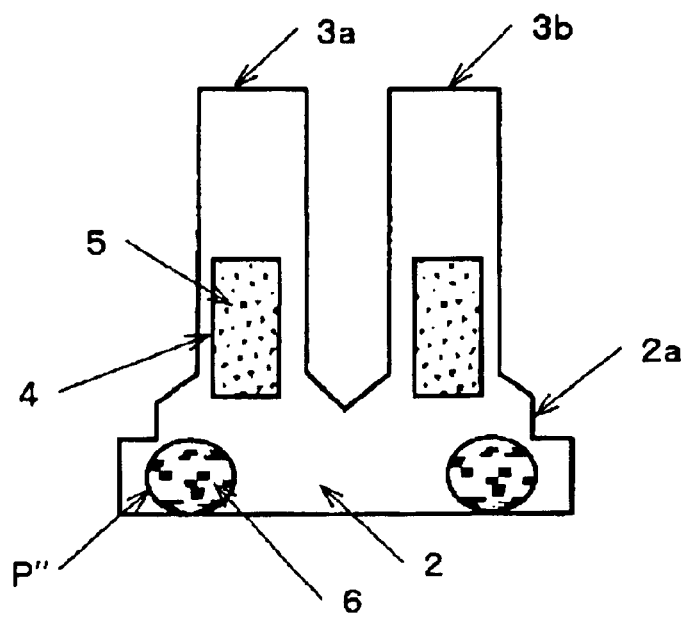
FIG. 8A is a front view of a conventional tuning fork-shaped crystal element.
Figure 8B:
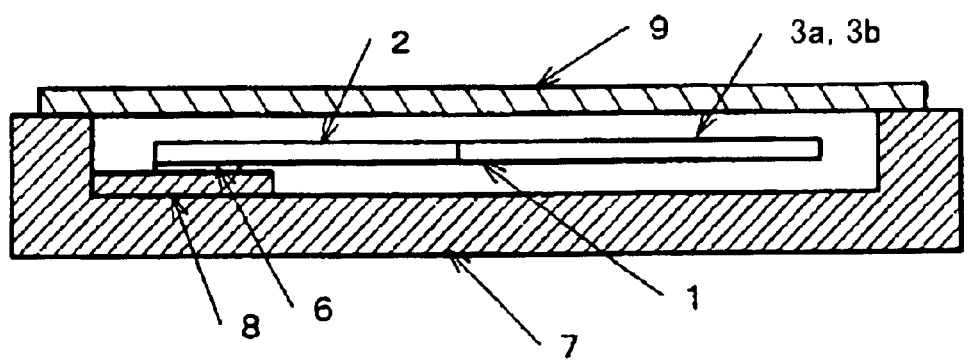
FIG. 8B is a cross-sectional view of a conventional tuning fork-type vibrator.

As becomes clear from this graph of the frequency change characteristics with regard to drops or impacts, the frequency change characteristics before and after drops are improved over that of the conventional shifting ratio b/a of 0 (curve (a)) when the shifting ratio b/a is 0.22 or 0.44 (curves (b) and (c)) When the shifting ratio b/a is 0.61 or 0.80 (curves (d) and (e)), the shock resistance is worse than in the conventional case. That is to say, as for the above-noted CI characteristics, due to the symmetry of the masses with respect to the center line A—A of the tuning fork-shaped crystal element 1 (see FIG. 2B), the frequency change characteristics before and after drops deteriorate when the symmetry is lost, and conversely, those characteristics are improved when the symmetry is sustained. This means that sustaining the symmetry of the masses suppresses stress due to asymmetry and stabilizes the adhesion with the electrically conductive adhesive 6 (see FIG. 6).

It should be noted that regardless of the shifting ratio b/a, in all tuning fork-type vibrators the vibrations were sustained, damage or breaking off of the tuning fork-shaped crystal element due to drops or impacts was prevented, and the vibrations did not stop, so that all tuning fork-type vibrators were satisfactory with regard to mechanical shock resistance. This is because, as explained in the conventional example, the tuning fork base portion 2 is widened by providing it with base protrusion portions 2a, thus increasing the surface area on which the electrically conductive adhesive 6 is applied.

Figure 4B:
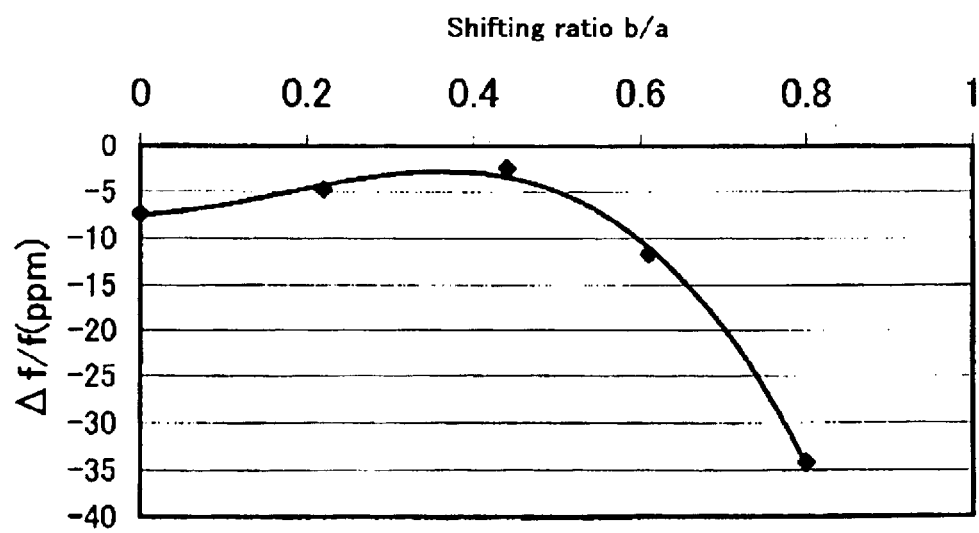

FIG. 4B is a graph of the frequency change characteristics of the tuning fork-type vibrator as a function of the shifting ratio b/a, when the tuning fork-type vibrators have been dropped 34 times. Here, the horizontal axis denotes the shifting ratio b/a and the vertical axis denotes the frequency deviation $\Delta f/f$ (ppm). The graph of the frequency change characteristics is an approximation curve based on the measurement points for the shifting ratios b/a of 0, 0.22, 0.44, 0.61 and 0.80.

As becomes clear from the graph of the frequency change characteristics (see FIG. 4B), like for the above-described minimum CI value, when the shifting ratio b/a is set to about 0.4, then a minimum value of the frequency deviation $\Delta f/f$ (ppm) before and after the drops of about −3 ppm can be achieved, which is less than half of the about −7.5 ppm of the conventional example (when the shifting ratio b/a is 0). Moreover, like for the CI characteristics, when the shifting ratio b/a is set to about 0.15 to 0.55, then frequency change characteristics that are equal to or better than the 7.5 ppm of the conventional example can be attained.

These experimental results confirmed that with the present embodiment, by making the tuning fork mask 11 asymmetric (see FIG. 2B) and reducing the size of the first slanted portion, the mass of the tuning fork-shaped crystal element is made left-right symmetric with respect to the center line A—A, so that the CI value can be reduced and the and the shock resistance can be improved. Moreover, according to these experimental results, in particular for the shock resistance, a minimum value of the frequency deviation $\Delta f/f$ of 3 ppm, which is less than half and therefore much less than the conventional value (−7.5 ppm) could be attained.

In the above embodiment, the tip P of the U-shape of the tuning fork mask is shifted horizontally from the original state to form the tuning fork groove in the tuning fork-shaped crystal element 1, but there is no limitation to horizontal shifting, and considering the symmetry due to the first slanted portion 13a, the tip P may also be shifted to the lower right. Moreover, the shifting ratio b/a was set to 0.15 to 0.55 to increase the CI and the shock resistance, but these numerical values depend on the shape of the tuning fork-shaped crystal element, so that the shifting ratio b/a can be selected as appropriate in accordance with the shape of the tuning fork-shaped crystal element with these numerical values as a general guide.

In the present embodiment, the initial state of the tuning fork mask 11 was a symmetric U-shape having a tip on the principal surface side (see FIG. 2A), but also when its base surface is flat and it does not have a tip on the principal surface side, a similar effect can be attained by slanting it to the lower right towards the +X surface side. In this case, the tip of the slanted portion becomes the shifting distance from the center. Also, the base protrusion portions of the tuning fork base portion 2 was provided with two levels, but a similar effect can also be attained if it is provided with one level. Furthermore, as long as the holding strength of the electrically conductive adhesive or the like is ensured, the tuning fork base portion 2 may also have the same width as the distance between the outer lateral surfaces of the two tuning fork arms 3a and 3b.

What is claimed is:

1. A tuning fork-type crystal vibrator comprising a tuning fork-shaped crystal element made of a pair of tuning fork arms having grooves in their principal surfaces, and a tuning fork base portion from which the pair of tuning fork arms extends, an outer shape of the tuning fork-shaped crystal element being processed by etching, wherein the tuning fork-type crystal vibrator has a protrusion, formed due to anisotropy of said etching, on a +X surface of the lateral faces of the tuning fork-shaped crystal element, and a first slanted portion rising from a −X direction in a +X direction formed in a tuning fork slit;

wherein a tip of the tuning fork slit on a principal surface side is shifted in +X direction from a center line bisecting the tuning fork-shaped crystal element in a width direction to a position at which tuning fork vibrations of the pair of tuning fork arms are balanced.

2. The tuning fork-type crystal vibrator according to claim 1, wherein the position at which the tuning fork vibrations of the pair of tuning fork arms are balanced is a region at which the crystal impedance is minimal.

3. The tuning fork-type crystal vibrator according to claim 1, wherein the region in which the crystal impedance is minimal is a region in which the crystal impedance is increased by 5% from the minimum value of the crystal impedance.

4. The tuning fork-type crystal vibrator according to claim 1, wherein the first slanted portion is formed with an asymmetric tuning fork mask having a left-right symmetric U-shape, in which a tip of the U-shape of the tuning fork mask is shifted in the +X direction.

5. The tuning fork-type crystal vibrator according to claim 4, wherein, when "a" represents an interval between the center line for left-right symmetry of the tuning fork mask and a vertical line at the +X surface side of the U-shape, and "b" represents a shift distance by which the tip of the U-shape has been shifted from the center line, the shifting ratio b/a of the shift distance b to the interval a is set to 0.15 to 0.55.

6. The tuning fork-type crystal vibrator according to claim 1, wherein the tuning fork base portion has base protrusion portions that that protrude from the outer lateral surfaces of the two tuning fork arms and that are wider than a distance between outer lateral surfaces of the two tuning fork arms; and wherein a second slanted portion rising from the −X direction to the +X direction is provided on an upper surface of the base protrusion portion.

* * * * *